United States Patent [19]
Giesecke et al.

[11] Patent Number: 4,832,989
[45] Date of Patent: May 23, 1989

[54] METHOD OF IMPROVING THE BOND STRENGTH OF ELECTROLESSLY DEPOSITED METAL LAYERS ON PLASTIC-MATERIAL SURFACES

[75] Inventors: Henning Giesecke, Leverkusen; Gerhard D. Wolf, Dormagen; Joachim Probst; Klaus Schuster, both of Leverkusen, all of Fed. Rep. of Germany

[73] Assignee: Bayer Aktiengesellschaft, Leverkusen, Fed. Rep. of Germany

[21] Appl. No.: 72,456

[22] Filed: Jul. 10, 1987

[30] Foreign Application Priority Data

Jul. 29, 1986 [DE] Fed. Rep. of Germany ....... 3625587

[51] Int. Cl.$^4$ ........................... B05D 3/04; B05D 3/10
[52] U.S. Cl. ..................................... 427/306; 427/304; 427/305
[58] Field of Search ......................... 427/304, 305, 306

[56] References Cited
U.S. PATENT DOCUMENTS 3,956,041  5/1976  Polishette et al. ................... 427/304
4,006,047  2/1977  Brummett et al. .................. 427/304
4,017,265  4/1977  Taylor ................................. 427/304
4,317,856  3/1982  Huthwelker et al. ............... 427/304

Primary Examiner—Norman Morgenstern
Assistant Examiner—Marianne L. Padgett
Attorney, Agent, or Firm—Sprung Horn Kramer & Woods

[57] ABSTRACT

Activator formulations which contain copolymers of (meth)acrylonitrile, styrenes, acrylates and/or unsaturated acids as binders are excellently suitable for preparing nonmetallic substrate surfaces for electroless metallization.

The metal deposits produced are notable for good bond strength.

5 Claims, No Drawings

METHOD OF IMPROVING THE BOND STRENGTH OF ELECTROLESSLY DEPOSITED METAL LAYERS ON PLASTIC-MATERIAL SURFACES

It is generally known that, for the purpose of achieving adhesive metal deposits on electrically nonconducting substrates, an adhesion-promoting lacquer based preferably on ABS polymers is first applied to the surface. The disadvantage of this pretreatment method is, however, that the moulded body coated with this lacquer layer has to be treated with a pickling solution before the actual metallization for the purpose of roughening up the surface (cf. e.g. DE-A-No. 1 958 839).

It has therefore already been proposed that nonmetallic substrate surfaces should be treated, without prior pickling, directly with activator solutions for electroless metallization which contain complicated mixtures of acrylonitrile/butadiene copolymers and optionally phenolic resins as adhesion promoters (cf. e.g. U.S. Pat. Nos. 3,305,460 and 3,560,257).

It has not been possible, however, for such a method to become established in industry since the bond strength of the metal layers produced is not sufficient and the adhesion-promoting polymers do not fulfil the high requirements, demanded in particular in printed circuit board technology, imposed on the thermal and electrical properties.

It has now been found that well-adhering metal layers can be applied, without the said disadvantages, to plastic-material surfaces if the latter are treated with an activator formulation which contains as binder a copolymer of (a) 5 to 80% by weight of a monomer containing cyano groups,
(b) 5 to 40% by weight of optionally ring-substituted (methyl)styrene and/or
(c) 5 to 40% by weight of (meth)acrylic acid ester and-/or
(d) 5 to 40% by weight of unsaturated carboxylic acid (derivatives).

Preferred copolymers contain 20 to 50% by weight of the component (a).

Suitable components (a) are esters of α-cyanoacrylic acid containing 1 to 8 carbon atoms in the alcohol radical, maleodinitrile, fumarodinitrile and, in particular, acrylonitrile and α-alkylacrylonitriles such as methacrylonitrile.

Suitable components (b) are: styrene, α-methylstyrene, o-chlorostyrene, p-chlorostyrene, o-, m- or p-methylstyrene, p-tert-butylstyrene or methyl methacrylate or mixtures thereof.

Examples of components (c) are: alkyl esters of acrylic acid containing 1 to 18 carbon atoms in the alcohol radical or alkyl esters of methacrylic acid containing 2 to 18 carbon atoms in the alcohol radical or mixtures thereof.

Examples of components (d) are: β-monoolefinic unsaturated mono- or dicarboxylic acids containing 3 to 5 carbon atoms or half-esters of maleic acid containing 2 to 18 carbon atoms in the alcohol radical or mixtures thereof.

The alcohol radicals cited may optionally also be substituted. As examples of substituents mention may be made of: halogens, in particular fluorine; ether groups, dialkylamino groups and hydroxyl groups.

The binders to be used according to the invention have a mean molecular weight of 1,000 to 1,000,000, preferably of 2,000 to 100,000. They are prepared by usual polymerization methods, the polymerization temperatures being between 20 to 200° C., preferably between 50 and 170° C., and pressures between $10^3$ mbar and $2 \cdot 10^4$ mbar being employed. It has proved advantageous to perform the copolymerization in solution.

Organometallic compounds of the 1st or 8th subgroups of the periodic system (in particular, Pd, Pt, Au and Ag), as are described for example in EP-A-No. 34 485, 81 438, 131 195, are suitable as activators in the formulations according to the invention. Particularly suitable are organometallic compounds of palladium formed with olefins (dienes), with α-, β-unsaturated carbonyl compounds, with crown ethers and with nitriles. Very particularly suitable are butadiene palladium dichloride, bisacetonitrile palladium dichloride, 4-cyclohexane-1,2-dicarboxylic acid anhydride palladium dichloride, mesityl oxide palladium chloride, 3-hepten-2-one palladium chloride, 5-methyl-3-hexen-2-one palladium chloride.

Of course, mixtures of these compounds can also be employed. The concentrations of organometallic activators are between 0.05 and 5% by weight referred to the noble metal in the formulations according to the invention. In special cases they may also be above this or below this. They may be dissolved or dispersed in the formulations. In this connection, a solution can be prepared also by adding solubulizers, eg. quaternary ammonium salts such as tetrabutylammonium bromide. If the activators are dispersed, care should be taken to ensure that particle sizes below 1 μm are achieved.

Particularly suitable for the method according to the invention are formulations which, in addition to the activators and the binders essential to the invention, contain solvents, fillers and also, optionally, surfactants and other agents.

Suitable as solvents in the formulations according to the invention are substances known in printing or painting technology such as aromatic and aliphatic hydrocarbons, for example toluene, xylene, benzine, petroleum ether; glycerol; ketones, for example acetone, methyl ethyl ketone, cyclohexanone, methyl isobutyl ketone; esters, for example butyl acetate, dioctyl phthalate, butyl glycollate; glycol ethers, for example ethyleneglycol monomethyl ether, diglymes, propyleneglycol monomethyl ether; esters of glycol ethers, for example ethyl glycol acetate, propyleneglycol monomethyl ether acetate; diacetone alcohol. Of course, mixtures of said solvents and their blends with other solvents can also be employed.

Suitable as fillers are agents known from printing and painting technology such as pigments, disperse silicic acids, clay minerals, soots and rheological additives.

As examples mention may be made of: aerosils, $TiO_2$, talc, iron oxides, silica gel, heavy spars, kaolins, quartz powder, smectites, colour blacks, graphites, zinc sulphides, chromium yellow, bronzes, organic pigments and chalk.

The formulations according to the invetion may contain flow-control agents (e.g. silicones, surfactants) and dyestuffs to improve their properties.

The preparation of the formulations according to the invention is carried out in general by mixing the components. In addition to simple stirring, especially suitable for this purpose are the wet comminution units usual in paint and printing technology such as kneaders, attrition mills, roller mills, high-speed stirrers, rotor-and-stator mills, ball mills and also stirred ball mills. Of course, the incorporation of the formulation constituents can also be performed in separate steps. For example, the activator may be dissolved or dispersed first in the binders and solvents and the fillers only then incorporated. Making a paste of the filler in the solvents beforehand employing high shear forces is also a possible variant of the method.

By applying the formulations according to the invention, surfaces can be activated for the purpose of an adhesive metallization by chemical plating. The application is carried out in general by methods known from paint or printing technology.

As examples mention may be made of: spraying on, brushing on, rolling on, offset printing, screen printing, tampon printing, dipping.

Suitable as substrates for the method according to the invention are glass, quartz, ceramic, enamel, paper, polyethylene, polypropylene, epoxy resins, polyesters, polycarbonates, polyamides, polyimides, polyhydantoins, ABS plastic materials, silicones, polyvinyl halides, and polyvinilidene fluoride in the form of boards, films, papers and non-wovens. Especially preferred are substrates as they are employed in printed circuit board manufacture, e.g. phenolic resin papers, glass-fibre reinforced epoxy boards, polyester and polyimide films, and ceramic.

After the formulations according to the invention have been applied to the surface, the solvents are removed. In general this is carried out by drying.

The drying can be carried out at various temperatures, for example between room temperature and 200° C. and under normal pressure or also in vacuo. The drying time can of course be varied considerably. Short times are frequently sufficient.

The surfaces thus nucleated must then be activated by reduction. For this purpose the reducing agents usual in electroplating such as, for example, formaldehyde, hypophosphite, boranes, hydrazine hydrate, may preferably be used. Naturally, other reducing agents are also possible.

An especially preferred embodiment in using the formulations according to the invention consists in performing the reduction in the metallization bath directly with the reducing agent for the electroless metallization. This procedure is especially suitable for nickel baths containing amine borane or copper baths containing formalin.

The surfaces activated with the formulations according to the invention can be electrolessly metallized in a further process step. Suitable for this purpose are particularly baths containing nickel, cobalt, iron, copper, silver, gold and palladium salts or mixtures thereof. Such metallization baths are known in the technology of electroless metallization.

The formulations according to the invention are particularly suitable for a partial activation of surfaces, very particularly for producing printed circuits, membrane keyboards, switching mats and sensors by usual printing methods such as, for example, screen printing, and subsequent additive chemical metallization.

EXAMPLE 1

Into a 12 l stainless-steel autoclave with horseshoe mixer and temperature regulation are introduced 2,600 parts by weight of propyleneglycol monomethyl ether acetate (PMA).

The autoclave is evacuated at room temperature to approx. 20 mbar to remove oxygen, and then flushed 3 times with nitrogen at 2 bar. Then nitrogen is compressed to an overpressure of 0.5 bar. The stirrer rotary speed is adjusted to 100 rev/min, and heating is carried out to an internal temperature of 120° C. The following mixtures are then dispensed via 2 proportioning pumps in the course of 4 hours:

Monomer mixture I 978 parts by weight of styrene
978 parts by weight of methyl methacrylate
978 parts by weight of n-butyl acrylate
1,954 parts by weight of acrylonitrile.

Initiator solution II 100 parts by weight of tert-butylperoctoate dissolved in
580 parts by weight of PMA.

After completion of the dispensing time, stirring is continued for 30 minutes at 120° C. and then a second initiator solution consisting of 16.8 parts by weight of di-tert-butyl peroxide dissolved in
84 parts by weight of PMA are fed in under pressure. For complete polymerization stirring is continued for a further 4 hours at 120° C. After cooling to 80° C., the highly viscous solution was discharged via the valve in the base of the autoclave. Yield: 8,130 g of solution The concentration of the solution was 58.8%, and the viscosity in 30% solution in PMA was 1,300 mPa.s at 25° C.

The solution forms a well-adhering, slightly yellowish transparent film on glass and polyester films after drying.

EXAMPLE 2

As in Example 1
2,444 parts by weight of methyl methacrylate
978 parts by weight of n-butyl acrylate and
1,466 parts by weight of acrylonitrile
were employed as a monomer mixture and dispensed at a temperature of 100° C. and postpolymerized. 7,950 g of polymer solution with a solids content of 60.1% by weight were obtained. The undiluted solution had a viscosity of 140,800 mPa.s at 25° C. The solution formed a faintly yellowish transparent film on drying.

EXAMPLE 3

The procedure was as in Example 2, but dispensing and postpolymerization were carried out at 120° C.

8,050 g of polymer solution with a solid fraction of 60.1% by weight were obtained. The viscosity of the undiluted solution was 48,000 mPa.s at 25° C. The film formed on drying from the solution was transparent and was coloured yellowish brown.

EXAMPLE 4

As in Example 1,
3,421 g of methyl methacrylate
978 g of n-butyl acrylate and
489 g of acrylonitrile
were employed as a monomer mixture and polymerized under otherwise identical conditions.

8,100 g of polymer solution with a solids content of 60% by weight were obtained. The viscosity of the solution was 3,000 mPa.s at 25° C. After drying the solution formed a clear transparent film.

EXAMPLE 5

66 parts by weight of a polymer solution as in Example 4
50 parts by weight of ethyleneglycol monomethyl ether acetate
4 parts by weight of aerosil and
1 part by weight of 3-hepten-2-one palladium chloride
are carefully mixed using a 3-roller mill.

The paste so obtained is printed through a screen on a PES film and the print dried for 30 minutes at 150° C. The print is then reduced for 5 minutes in a 1% aqueous dimethylamine-borane solution, carefully rinsed and then metallized for 1 hour in an alkaline formalin-containing copper bath (1.7 g/l copper, 5 g/l NaOH, 8 g/l formalin) at 60° C. A cohesive copper layer is obtained. Bond strength according to DIN 53 151, characteristic value GT 4.

EXAMPLE 6

As in Example 5, a print paste is prepared with a polymer as in Example 2 and a PES film printed and copper-plated with it. A cohesive copper layer is obtained. Bond strength according to DIN 53 151, characteristic value GT 3.

EXAMPLE 7

As in Example 5, a screen print paste is prepared with a binder as in Example 1 and a PES film printed and copper-plated with it. A cohesive copper layer is obtained. Bond strength according to DIN 53 151: characteristic value GT 1.

Bond strength according to DIN 53 494: 11 N.

EXAMPLE 8

260 parts by weight of a polymer solution as in Example 1
290 parts by weight of ethyleneglycol monomethyl ether acetate
120 parts by weight of butyl glycollate
40 parts by weight of aerosil and
6 parts by weight of butadiene palladium chloride
are mixed in a high-speed stirrer. The paste so obtained is printed through a screen onto a PES film and the print is dried for 1 hour at 100° C. The print is then nickel-plated for 30 minutes in a nickel bath containing amine borane. A cohesive nickel layer is obtained.

Bond strength according to DIN 53 494: 14 N
Viscosity of the print paste: 3,600 mPa.s.

EXAMPLE 9

A conductor track pattern is printed on a glassfibre reinforced epoxy-resin board (FR 4 material) with a print paste as in Example 8. The surface is then dried for 1 hour at 150° C. and copper-plating is carried out for 1 hour in a copper-plating bath as in Example 5. A precise image of the conductor track pattern with a copper deposit of 3 $\mu$m is obtained.

Bond strength as specified in DIN 53 151: characteristic value GT 1.

EXAMPLE 10

480 parts by weight of a polymer solution in ethyleneglycol ethyl ether acetate with a solids content of 30% consisting of a copolymer prepared as in Example 1 from
20 parts by weight of acrylonitrile
20 parts by weight of methacrylonitrile
20 parts by weight of methyl methacrylate
20 parts by weight of styrene
20 parts by weight of n-butyl acrylate
20 parts by weight of a smectite (Bentone(R) 38)
8 parts by weight of bisacetonitrile palladium dichloride
were carefully mixed in a high-speed mixer.

The mixture produced is spread on a Tyvek paper surface with a doctor blade, dried for 2 hours at 80° C. and then reduced and copper-plated as in Example 5. A cohesive copper layer is obtained.

EXAMPLE 11

In a manner similar to Example 1, a 40% solution in PMA is prepared of a copolymer consisting of
15 parts by weight of styrene
20 parts by weight of methyl methacrylate
20 parts by weight of n-butyl acrylate
25 parts by weight of acrylonitrile
20 parts by weight of butyl α-cyanoacrylate. 180 parts by weight of this solution were mixed as in Example 10 with
90 parts by weight of ethyleneglycol methyl ether acetate
2 parts by weight of butadiene palladium dichloride and
17 parts by weight of aerosil.

The print paste produced in this process is printed on a PES film as in Example 8, dried and metallized. A nickel-plated film is obtained. Bond strength according to DIN 53 151: characteristic value GT 1.

We claim:

1. Method for improving the bond strength of electrolessly deposited metal layers on plastic-material surfaces by treatment of the latter with binder-containing activator formulations without pickling, the improvement wherein a copolymer of
    (a) 5 to 80% by weight of a monomer containing cyano groups and 5 to 40% by weight of (meth)acrylic acid ester;
    (b) 5 to 80% by weight of a monomer containing cyano groups and 5 to 40% by weight of unsaturated carboxylic acid (derivatives);
    (c) 5 to 80% by weight of a monomer containing cyano groups, 5 to 40% by weight of (meth) acrylic acid ester and 5 to 40% by weight of unsaturated carboxylic acid (derivatives);
    (d) 5 to 80% by weight of a monomer containing cyano groups, 5 to 40% by weight of optionally ring-substituted (methyl) styrene and 5 to 40% by weight of (meth) acrylic acid ester;
    (e) 5 to 80% by weight of a monomer containing cyano groups, 5 to 40% by weight of optionally ring-substituted (methyl) styrene and 5 to 40% by weight of unsatuarated carboxylic acid (derivatives); or
    (f) 5 to 80% by weight of a monomers containing cyano groups, 5 to 40% by weight of optionally ring-substituted (methyl) styrene, 5 to 40% by weight of (meth) acrylic acid ester and 5 to 40% by weight of unsaturated carboxylic acid (derivatives) is used as the binder.

2. Method according to claim 1, characterized in that metallorganic compounds of the 1st or 8th subgroup are used as activators.

3. Method according to claim 1, characterized in that copolymers with a cyano monomer content of 20 to 50% by weight are used as binder.

4. Method according to claim 1, characterized in that, in addition to the binders, the formulations contain metallorganic compounds as activators and also fillers and organic solvents.

5. In a method of producing printed circuits, membrane keyboards, switching mats and sensors wherein metal layers are electrolessly deposited on plastic-material surfaces by treatment of the latter with binder-containing activator formulations without pickling the improvement wherein the binder-containing formulation according to claim 1 is used as the print paste.

* * * * *